United States Patent [19]
Valster

[11] Patent Number: 5,381,024
[45] Date of Patent: Jan. 10, 1995

[54] RADIATION-EMITTING SEMICONDUCTOR DEVICE WITH AN INTERMEDIATE BARRIER LAYER

[75] Inventor: Adriaan Valster, Eindhoven, Netherlands

[73] Assignee: U.S. Philips Corporation, New York, N.Y.

[21] Appl. No.: 246,392

[22] Filed: May 20, 1994

Related U.S. Application Data

[63] Continuation of Ser. No. 68,639, Jun. 6, 1991, abandoned, which is a continuation of Ser. No. 495,016, Mar. 15, 1990, abandoned.

[30] Foreign Application Priority Data

Mar. 28, 1989 [NL] Netherlands ................. 8900748

[51] Int. Cl.⁶ .................... H01L 33/00; H01S 3/19
[52] U.S. Cl. ........................ 257/97; 257/13; 257/95; 257/96; 257/81; 257/472; 372/45; 372/46
[58] Field of Search ............ 357/16, 17, 30; 372/45, 372/46; 437/5; 257/13, 94, 97, 95, 99, 472

[56] References Cited

U.S. PATENT DOCUMENTS

| | | | |
|---|---|---|---|
| 4,427,841 | 1/1984 | Rahilly | 437/5 |
| 4,615,032 | 9/1986 | Holbrook et al. | 372/45 |
| 4,694,460 | 9/1987 | Hayakawa et al. | 372/45 |
| 4,740,976 | 4/1988 | Kajimura et al. | 357/17 |
| 4,773,945 | 9/1988 | Woolf et al. | 437/5 |
| 4,792,958 | 12/1988 | Ohba et al. | 372/45 |
| 4,829,357 | 5/1989 | Kasahara | 357/17 |
| 4,845,724 | 7/1989 | Hayakawa et al. | 372/45 |
| 4,905,057 | 2/1990 | Ohishi et al. | 357/17 |
| 4,916,709 | 4/1990 | Ota et al. | 372/45 |

FOREIGN PATENT DOCUMENTS

| | | | |
|---|---|---|---|
| 58-219789 | 12/1982 | Japan | 357/17 |
| 59-165474 | 9/1984 | Japan | 357/17 |
| 61-285781 | 12/1986 | Japan | 372/46 |
| 2038538 | 7/1980 | United Kingdom | 372/46 |

OTHER PUBLICATIONS

Sze, S. M., *Semiconductor Devices*, 1985 pp. 258–260 and pp. 267–268.

Junko Ogawa, "Degradation in GaAs/AlGaAs double-heterostructure light emitting diodes", App. phys. Lett 51 (23), 7 Dec. 1987, pp. 1949–1950.

*Primary Examiner*—Mark V. Prenty
*Assistant Examiner*—John F. Guay
*Attorney, Agent, or Firm*—Steven R. Biren

[57] ABSTRACT

Radiation-emitting semiconductor diodes in the form of a laser diode or in the form of an LED form important components in data-processing systems. There is a particular need for diodes which emit in the visible part of the spectrum, which have a low starting current and which can be manufactured at low cost. A radiation-emitting semiconductor diode comprising above the active layer a cladding layer and a GaAs contact layer, into which a mesa-shaped strip is etched, and provided on the upper and the lower side with a conductive layer, which forms outside the mesa-shaped strip a junction forming a barrier with a subjacent semiconductor layer, partly satisfies the aforementioned requirements. Such a diode may further advantageously include an active layer and cladding layers, which contain (Al)GaInP, and an intermediate layer between the cladding layer and the contact layer, which extends outside the mesa-shaped strip and forms at these areas current-limiting regions due to the junction forming a barrier with the conducting layer. This intermediate layer offers the possibility to optimize the barrier effect, independent of the properties of the remaining semiconductor layers. The intermediate layer can include InGaP, InAlGaP or AlGaAs.

9 Claims, 3 Drawing Sheets

RADIATION-EMITTING SEMICONDUCTOR DEVICE WITH AN INTERMEDIATE BARRIER LAYER

This is a continuation of application Ser. No. 068,639, filed Jun. 6, 1991, which is a continuation of Ser. No. 495,016 filed Mar. 15, 1990, both now abandoned.

BACKGROUND OF THE INVENTION

The invention relates to a radiation-emitting semiconductor diode comprising a semiconductor body having a semiconductor substrate of a first conductivity type and consisting of gallium arsenide (GaAs), which is provided on the lower side with a conducting layer and on which are at least successively disposed a first cladding layer of the first conductivity type, an active layer, a second cladding layer of a second conductivity type opposite to the first conductivity type and a contact layer of the second conductivity type and consisting of gallium arsenide (GaAs), the semiconductor body comprising a mesa-shaped strip, which adjoins its surface, which at least comprises the contact layer and on which a conducting layer is disposed, which extends beyond the mesa-shaped strip and forms outside it with a semiconductor layer underlying the conducting layer a junction forming a barrier. The invention further relates to a method of manufacturing a radiation-emitting semiconductor diode, in which there are successively provided on a semiconductor substrate of gallium arsenide (GaAs) at least a first cladding layer of the first conductivity type, an active layer, a second cladding layer of the second conductivity type and a contact layer of the second conductivity type and consisting of gallium arsenide (GaAs), while by means of photolithography and etching a mesa-shaped strip is formed, which comprises at least the contact layer, after which a conducting layer is provided on the substrate and a conducting layer is provided over and outside the mesa-shaped strip, which forms outside the mesa-shaped strip with a semiconductor layer underlying the conducting layer a junction forming a barrier.

Such radiation-emitting diodes, more particularly when they are in the form of a laser, constitute radiation sources for inter alia data-processing systems, such as printers, by means of which information is written, and such as "optical disk" systems, in which information is read out —for example so-called compact disc (CD) players and Video Long-Play (VLP) systems—or is written and read out—for example Digital Optical Recording (DOR). Also when such diodes are in the form of LED's, there are numerous applications in optoelectronic systems.

Such a radiation-emitting diode and such a method of manufacturing it, are known from the article by M. C. Amann, "New stripe-geometry laser with simplified fabrication process", which is published in Electron Lett., Vol. 15, No. 14, Jul. 5, 1979, pp. 441–442. In this article, a radiation-emitting semiconductor diode is described, in which are disposed on an n-type GaAs substrate an n-type AlGaAs cladding layer, a GaAs active layer, a p-type AlGaAs cladding layer and a p-type GaAs contact layer. Both the substrate and the contact layer are provided with a conductive layer. The radiation-emitting diode comprises a mesa-shaped strip, which comprises at least the GaAs contact layer, which is etched away outside it, as a result of which at these areas a junction constituting a barrier is formed between the upper conductive layer and the second cladding layer. The radiation-emitting diode comprises a strip-shaped region, of which the mesa-shaped strip forms part, within which electromagnetic radiation can be produced by a present pn junction upon current passage in the forward direction. Due to the presence of the junction constituting a barrier, the current is mainly limited during operation to the mesa-shaped strip.

A disadvantage of the known semiconductor diode is that the properties of the junction constituting a barrier cannot be adjusted independently of, for example, the properties of the cladding layer. The disadvantage therefore resides in the fact that the properties of the cladding layer should be at the same time optimal for fulfilling various functions. In fact, the cladding layer fulfills several functions: optical and electrical enclosure of photons and charge carriers, respectively, in the active layer, current passage layer and barrier former. In the known method, moreover, a further disadvantage is obtained if the mesa-shaped strip also should comprise a part of the cladding layer in order to obtain so-called index guiding. In this case, the second cladding layer should be etched back to a small thickness outside the mesa-shaped strip, which process can be controlled only with difficulty. Moreover, if the thickness of the second cladding layer is not constant over the surface of a substrate, which in practice—especially when large substrates are used—is mostly the case, the etching process will result in a comparatively large spread in the thickness of the second cladding layer outside the mesa-shaped strip. As a result, radiation-emitting diodes are obtained having different properties, for example different degrees of index guiding, which is undesirable. A great disadvantage of the known semiconductor diode is—as already stated above—that the properties of the cladding layer should at the same time be optimal for fulfilling various functions.

SUMMARY OF THE INVENTION

The present invention has inter alia for its object to provide a semiconductor diode emitting in the visible part of the spectrum and a method of manufacturing same, which do not suffer or suffer at least to a considerably lesser extent from the limitations mentioned, as a result of which inexpensive diodes emitting visible radiation and having favorable properties, such as an effective current limitation, are obtained.

The invention is based inter alia on the recognition of the fact that the object aimed at can be realized by the presence of an additional layer, which can fulfill various functions.

A radiation-emitting semiconductor diode of the kind described above is characterized according to the invention in that the cladding layers comprise indium aluminum gallium phosphide (InAlGaP) or indium aluminum phosphide (InAlP), the active layer comprises indium gallium phosphide (InGaP) or indium aluminum gallium phosphide having a lower aluminum content than the cladding layers and an intermediate layer is provided between the conducting layer and the second cladding layer, which intermediate layer forms with the conducting layer the junction forming a barrier, is of the second conductivity type and comprises a semiconductor material, whose band gap lies between that of the second cladding layer and that of the contact layer. The properties of the intermediate layer can be chosen to a certain extent more freely than the properties of the second cladding layer. The intermediate layer is farther remote from the active layer than the cladding layer and will therefore exert less influence on the active layer: outdiffusion from this intermediate layer will not reach the active layer very quickly, as a result of which, even if the doping of the intermediate layer is chosen to be high, the risk of the p-n junction moving away from the active layer remains low. Moreover, in order to form a barrier with the conducting layer, the intermediate layer requires with respect to the cladding layer only a comparatively small thickness, as a result of which the intermediate layer exerts comparatively little influence on, for example, the current passage parallel to and perpendicular to the layer structure. A method of manufacturing a radiation-emitting semiconductor diode according to the invention is characterized according to the invention in that as semiconductor material indium aluminum gallium phosphide (InAlGaP) or indium aluminum phosphide (InAlP) is chosen for the cladding layers and indium gallium phosphide (InGaP) or indium aluminum gallium phosphide (InAlGaP) having a lower aluminum content than the cladding layers is chosen for the passive layer, in that an intermediate layer is provided between the second cladding layer and the contact layer, which intermediate layer consists of a semiconductor material whose band gap lies between that of the second cladding layer and that of the contact layer, and in that, when etching the mesa-shaped strip, the etching treatment is stopped on this layer. Since, when etching the contact layer, the intermediate layer can be used as etch stopper layer, the thickness of the second cladding layer outside the mesa-shaped strip becomes exactly equal to the thickness in which this cladding layer was provided. As a result, especially if index-guided lasers are desired, the process according to the invention is less sensitive to thickness differences in the cladding layer as compared with the known process. An important additional advantage of the method according to the invention is that it is very simple: after the growth of a semiconductor layer structure in one uninterrupted growing process, after mesa etching and after a bilateral metallization, the individual semiconductor diodes from the substrate can be isolated. This applies both to radiation-emitting semiconductor diodes of the so-called "gain-guided" type and to such diodes of the "index-guided" type, which can therefore both be manufactured in a simple manner and at low cost. The semiconductor materials used render it possible to manufacture diodes having a very low emission wavelength, i.e. about 600 nm, for example by an active layer containing about 15 at. % of aluminum.

In a first embodiment, the intermediate layer comprises indium gallium phosphide (InGaP) or indium aluminum gallium phosphide (InAlGaP) having a lower aluminum content than the cladding layers. A composition of the intermediate layer, which corresponds to $In_{0.49}Ga_{0.51}P$—a composition whose associated lattice constant corresponds to that of GaAs—is very suitable for utilizing the possibilities offered by this layer: such an intermediate layer forms with the conducting layer a barrier, which is sufficiently large to render the current through the current-limiting regions substantially zero at the operating voltage of the semiconductor diode, divides the band gap step between the second cladding layer ($E_g=2.3$ eV) and the contact layer ($E_g=1.4$ eV) substantially into two equal parts ($E_g=1.9$ eV) and can act very suitably as an etch stopper layer. The cladding layers will generally contain about 20 to 50 at. % of Al, while the active layer and the intermediate layer will generally contain from 0 to 15 at. % of Al. With a given Al content, the In and Ga contents of the quaternary aluminum-containing layers are fixed if it is assumed that: the sum of the contents of the III elements is unity and all layers have substantially the same lattice constant as the substrate.

In another embodiment of a radiation-emitting diode according to the invention, the intermediate layer comprises AlGaAs. A conductive layer can very suitably form a junction constituting a barrier also with this material, as a result of which an effective current limitation can be realized. Such a layer has the advantage that the lattice constant for every composition is substantially equal to that of GaAs, as a result of which a very accurate control of the composition is not necessary. If the Al content of the layer is about 40 at. %, the band gap is about 1.9 eV, which is a favorable value, as set out hereinbefore.

In a further embodiment of a radiation-emitting diode according to the invention, the intermediate layer has a doping of $5.10^{17}$ to $4.10^{18}$ at/cm$^3$ and the second cladding layer has a doping of $1.10^{17}$ to $5.10^{17}$ at/cm$^3$. These dopings have proved to be very suitable. A high doping of the intermediate layer favors the current-voltage characteristic. A lower doping of the second cladding layer prevents that by diffusion during the growth of the layers the pn junction is removed too far from the active layer, especially if the second cladding layer contains a p-type dopant, which in general diffuses comparatively rapidly.

In a further embodiment of a radiation-emitting diode according to the invention, the intermediate layer has a gradient in the doping such that the doping is higher on the side of the second cladding layer and is lower on the side of the contact layer. As a result, an optimum effect of the intermediate layer becomes possible: on the one hand, a lower doping favors the formation of a large barrier between the intermediate layer and the conductive layer, as a result of which the current limitation is improved, while on the other hand a higher doping favors the current-voltage characteristic.

In a further embodiment of a radiation-emitting diode according to the invention, the intermediate layer has a gradient in the composition such that it is higher on the side of the second cladding layer and is lower on the side of the contact layer. Also as a result thereof, an optimum effect of the intermediate layer becomes possible: on the one hand, a low band gap on the side of the conductive layer favors the formation of a large barrier between the intermediate layer and the conductive layer, as a result of which the effectiveness of the current limitation is improved, while on the other hand a gradient in the band gap favors the current-voltage characteristic.

In a further embodiment of a radiation-emitting diode according to the invention, the intermediate layer has a thickness lying between 200 and 2000 Å. The upper limit is determined by the occurrence of undesired current spread in the intermediate layer, more particularly if the latter has a comparatively low resistance, while the lower limit is determined by the desired current-voltage characteristic. In practice, preferably a thickness of about 800 Å will be used.

In a further embodiment of a radiation-emitting diode according to the invention, the conductive layer comprises one or more of the metals Pt, Cr or Ti. These metals have proved to be very suitable to realize a Schottky barrier of sufficient height (size), especially if the intermediate layer is of the p-conductivity type.

In a further embodiment of a radiation-emitting semiconductor diode according to the invention, the semiconductor body comprises within the mesa-shaped strip between the intermediate layer and the contact layer a third cladding layer and a further intermediate layer which is disposed thereon and of which the value of the band gap lies between that of the third cladding layer and that of the contact layer. As a result, if the diode is constructed as a laser diode, that is to say that the strip-shaped region between two mirror surfaces constitutes a resonant cavity and the current strength is sufficient for producing coherent electromagnetic radiation, the possibility is obtained of manufacturing an index-guided laser. In this case, the second cladding layer is made fairly thin (for example about 0.2 μm) so that the radiation produced is subjected outside the mesa-shaped strip to a refractive index different from that inside said strip, as a result of which a step in the effective refractive index therefore occurs. Since the second and third cladding layers will mostly have the same band gap, it is not necessary in this case that the intermediate layer divides a band gap step into two more or less equal parts. The third cladding layer serves to obtain within the mesa-shaped strip an effective enclosure of the radiation, while the further intermediate layer solely serves to divide the band gap step between the third cladding layer and the contact layer into two approximately equal parts with a view to a favorable current-voltage characteristic. In connection with this embodiment, a second embodiment of a method according to the invention comprises the steps of providing a third cladding layer and a further intermediate layer between the second cladding layer and the contact layer and of forming the mesa-shaped strip as far as the intermediate layer. In this manner, an index-guided diode is obtained, which has at the same time the advantages of a small current spread. The manufacture is essentially equal to the manufacture of the diodes according to preceding embodiments.

BRIEF DESCRIPTION OF THE DRAWING

A further explanation of the invention will now be given with reference to two embodiments and the accompanying drawing, in which.

Figure 1:
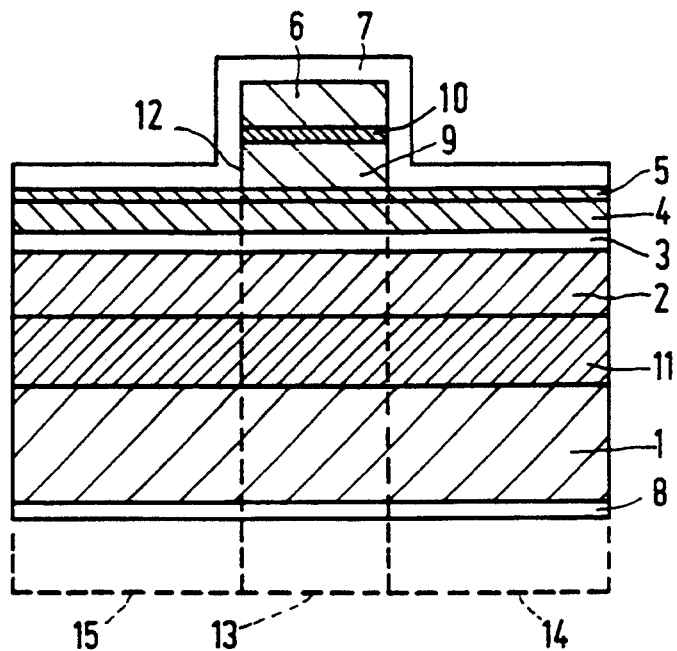
FIG. 1 shows in cross-section a first embodiment of a radiation-emitting semiconductor diode according to the invention.

The Figures are schematic and not drawn to scale, while more particularly the dimensions in the direction of thickness are exaggerated for the sake of clarity. Corresponding parts are generally designated by the same reference numerals in the various embodiments. Semiconductor regions of the same conductivity type are generally cross-hatched in the same direction.

DESCRIPTION OF THE PREFERRED EMBODIMENTS

FIG. 1 shows in cross-section a first embodiment of a radiation-emitting semiconductor diode according to the invention. The semiconductor diode comprises a semiconductor body having a substrate region 1 of a first, in this case n, conductivity type, which is provided with a connection conductor 8 and consists in this embodiment of monocrystalline gallium arsenide. On this substrate is provided a semiconductor layer structure, which comprises inter alia a buffer layer 11 of the same, so in this case n, conductivity type. On this structure are successively provided a first cladding layer 2 of the n-conductivity type, an active layer 3, and a second cladding layer 4 of the opposite, so in this case p, conductivity type. Above this structure are disposed within a mesa-shaped strip 12 a third cladding layer 9 of the opposite, so in this case p, conductivity type, a further intermediate layer 10 of the opposite, so in this case p, conductivity type and a contact layer 6, also of the opposite, so in this case p, conductivity type. Over this mesa-shaped strip is provided a conductive layer 7, which forms with an underlying layer outside the mesa-shaped strip 12 a junction constituting a barrier. As a result, two strip-shaped regions 14 and 15 are formed in the semiconductor body, through which regions no or substantially no current flows below a given voltage if the conductive layers 7 and 8 are included in a current circuit. Within the semiconductor body a mesa-shaped region 13 is disposed, of which the mesa-shaped strip 12 forms part, within which a pn junction is disposed, which with a sufficiently high current strength in the forward direction leads to emission of electromagnetic radiation. Since the conductive layer 7 forms a good electrical contact with the contact layer 6, the region 13 constitutes a preferred path for the electric current. In this embodiment, the radiation-emitting semiconductor diode is constructed as a diode laser, i.e. of the index-guided type. This means that with a sufficiently high current strength the emission is coherent. In connection with the construction as diode laser, the mesa-shaped strip 12 is limited at right angles to the longitudinal direction by two parallel mirror surfaces, which lie in the plane of the drawing and coincide with natural cleavage surfaces of the crystal from which the semiconductor body is formed. As a result, a resonant cavity for the voltage produced is formed within the strip-shaped region 13 in the active layer 3. According to the invention, an intermediate layer 5 is located between the conducting layer 7 and the second cladding layer 4, which intermediate layer forms with the conducting layer 7 the junction forming a barrier, is of the second, so in this case p, conductivity type and comprises a semiconductor material having a band gap lying between that of the second cladding layer 4 and that of the contact layer 6. The properties of this intermediate layer 5 are more or less independent of the properties of the second cladding layer 4 and are chosen in accordance with the invention so that a number of advantages are obtained. As appears from the following table, the second cladding layer 4 comprises, like the remaining cladding layers, indium aluminum gallium phosphide and the contact layer 6 comprises gallium arsenide. In this example, the intermediate layer 5 comprises indium gallium phosphide, whose band gap lies between that of the second cladding layer 4 and that of the contact layer 6. As a result, the intermediate layer 5 can act as etch stopper layer when the mesa-shaped strip 12 is formed. Further, with this composition of the intermediate layer 5, the conductive layer 7 and the intermediate layer 5 form at the area at which they adjoin each other a junction constituting a barrier, which has very favorable current-blocking properties at the operating voltage of the semiconductor diode, which in this embodiment is approximately 2.5 V. Further, as also appears from the following table, the doping of the intermediate layer, which in this embodiment is $1.10^{18}$ at/cm$^3$, is chosen so that within the mesa-shaped strip 12 a good current passage from the third cladding layer 9 to the second cladding layer 4 is possible. In this embodiment, the following compositions, dopings and thicknesses are used for the various semiconductor layers.

| Layer | Semiconductor | Type | Doping concentr. (at/cm$^3$) | Thickness ($\mu$m) | Band-gap |
|---|---|---|---|---|---|
| 1 | GaAs (substrate) | N | $2 \times 10^{18}$ | 350 | 1.4 |
| 11 | GaAs (buffer layer) | N | $2 \times 10^{18}$ | 0.5 | 1.4 |
| 2 | In$_{0.5}$Al$_{0.3}$Ga$_{0.2}$P | N | $2 \times 10^{18}$ | 0.8 | 2.3 |
| 3 | In$_{0.5}$Ga$_{0.5}$P | — | — | 0.08 | 1.9 |
| 4 | In$_{0.5}$Al$_{0.3}$Ga$_{0.2}$P | P | $4 \times 10^{17}$ | 0.2 | 2.3 |
| 5 | In$_{0.5}$Ga$_{0.5}$P | P | $1 \times 10^{18}$ | 0.1 | 1.9 |
| 9 | In$_{0.5}$Al$_{0.3}$Ga$_{0.2}$P | P | $4 \times 10^{17}$ | 0.7 | 2.3 |
| 10 | In$_{0.5}$Ga$_{0.5}$P | P | $1 \times 10^{18}$ | 0.1 | 1.9 |
| 6 | GaAS (contact layer) | P | $2 \times 10^{18}$ | 0.5 | 1.4 |

The radiation emitted by this semiconductor diode has a wavelength of about 680 nm. The width of the mesa-shaped strip 12 is about 3 $\mu$m. The conductive layer 8 on the substrate 1 is in this embodiment a gold-germanium-nickel layer having a thickness of about 1000 Å. The conductive layer 7 comprises in this embodiment platinum, gold and tantalum layers having thicknesses of about 1000, about 500 and about 2500 Å, respectively.

Figure 4:
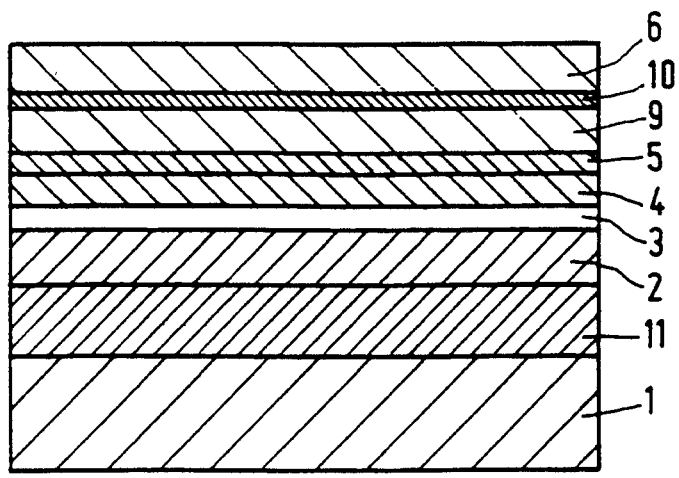
FIGS. 4 and 5 show in cross-section the radiation-emitting semiconductor diode of FIG. 1 at successive stages of manufacture.
Figure 5:
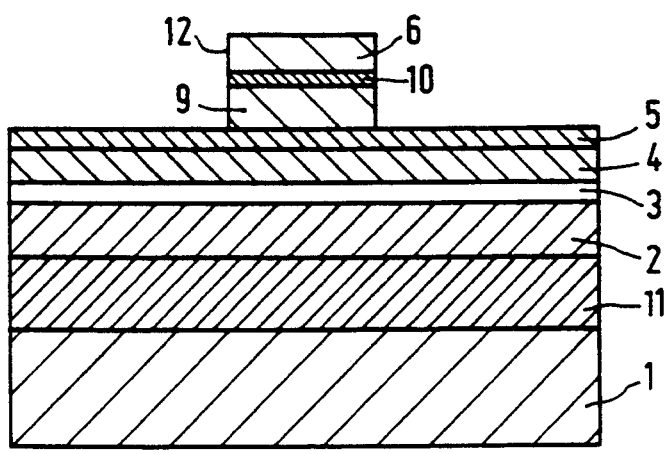

The radiation-emitting semiconductor diode described is manufactured according to the invention in the following manner (cf. FIGS. 4 and 5). The starting material is a substrate 1 of monocrystalline n-type gallium arsenide having a doping concentration of $2.10^{18}$ at/cm$^3$ and a thickness of, for example, 350 $\mu$m. After the surface, which preferably has a misorientation of at most 6° with respect to the (001) orientation, has been polished and etched, there are grown successively on this surface, for example from the gaseous phase by means of OMVPE (=Organo-Metallic Vapor Phase Epitaxy): a 0.5 $\mu$m thick layer 11 of n-type GaAs having a doping concentration of about $2.10^{18}$ at/cm$^3$, a 0.8 $\mu$m thick layer 2 of n-type In$_{0.5}$Al$_{0.30}$Ga$_{0.20}$P having a doping concentration of about $2.10^{18}$ at/cm$^3$, a 0.08 $\mu$m thick layer 3 of In$_{0.49}$Ga$_{0.51}$P, a 0.2 $\mu$m thick layer 4 of p-type In$_{0.5}$Al$_{0.30}$Ga$_{0.20}$P having a doping concentration of about $4.10^{17}$ at/cm$^3$, a 0.08 $\mu$m thick layer 5 of p-type In$_{0.49}$Ga$_{0.51}$P having a doping concentration of $1.10^{18}$ at/cm$^3$, a 0.7 $\mu$m thick layer 9 of p-type In$_{0.50}$Al$_{0.30}$Ga$_{0.2}$P having a doping concentration of $4.10^{17}$ at/cm$^3$, a 0.08 $\mu$m thick layer 10 of p-type In$_{0.49}$Ga$_{0.51}$P having a doping concentration of about $1.10^{18}$ at/cm$^3$ and a 0.5 $\mu$m thick layer 6 of p-type GaAs having a doping concentration of about $1.10^{18}$ at/cm$^3$. A diagrammatic cross-section of the structure manufactured in this manner is shown in FIG. 4. This multilayer structure may also be grown by means of other growing techniques that are used here, such as growth from the liquid phase by means of LPE (=Liquid Phase Epitaxy), in which event the orientation of the substrate 1 is preferably substantially the (001) orientation, although for practical reasons the use of this technique is not very obvious in the material system given. This also applies to the growth from the gaseous phase by means of the so-called VPE (=Vapor Phase Epitaxy) technique. A more apparent alternative for the growing technique is for the material system given the so-called molecular beam epitaxy (MBE). For other material systems than that chosen here, however, the aforementioned LPE and VPE techniques may be particularly suitable. For details with regard to the OMVPE technique used here, reference may be made to the survey article by M. J. Ludowise "Metal-Organic Vapor Deposition of III-V Semiconductors" in Journal of Applied Physics, 58 (1985), 31. After the semiconductor layer structure thus obtained has been removed from the growth apparatus and has been cleaned in a usual manner, a mesa-shaped strip 12 is etched (cf. FIG. 5) by means of photolithography and commonly-used etchants. First the GaAs contact layer 6 is removed by means of an etchant comprising NH$_3$, H$_2$O$_2$ and H$_2$O in the ratio of 2:1:50, whose etching rate at room temperature is about 0.7 $\mu$m/hour, and the In0.49Ga0.51P layer 10 is removed by means of an etchant comprising concentrated sulphuric acid, whose etching rate at 70° C. is about 350 Å/min. Subsequently, the In$_{0.50}$Al$_{0.30}$Ga$_{0.20}$P layer is etched selectively by an etchant comprising concentrated phosphoric acid, whose etching rate at 60° C. is about 0.7 $\mu$m/min. The underlying In$_{0.50}$Ga$_{0.50}$P intermediate layer 5 then acts as etch stopping layer. After the structure thus obtained has again been cleaned in a usual manner, a conductive layer 8 consisting, for example, of a gold-germanium-nickel layer having a thickness of about 1000 Å is provided on the substrate 1 by means of, for example, sputtering (cf. FIG. 1). Finally, a conductive layer 7 consisting, for example, of a platinum layer, a tantalum layer and a gold layer, whose thicknesses are about 1000, about 500 and about 2500 Å, respectively, is provided, for example by the same technique, over the upper side of the structure. After cleavage of the substrate in a usual manner, the individual radiation-emitting semiconductor diodes—in this case diode lasers of the index-guided type—are ready to be finished.

It should be noted here that the semiconductor layers may also have compositions other than those mentioned here. This depends inter alia upon the desired wavelength of the radiation to be produced. In addition, especially the aluminum content of the cladding layers may be varied in order to influence the enclosure and hence the extent of index-guiding (especially as to the second cladding layer). The composition and the doping concentration of the intermediate layer may also be varied in order to obtain an optimal tuning to the different functions of this layer. For example, this layer may have a gradient in both quantities so that the formation of an effective barrier can be combined with a favorable current-voltage characteristic. The composition and the doping of the further intermediate layer 10 may be chosen so that a favorable current-voltage characteristic is obtained for the diode laser. It is particularly desirable for this purpose that the composition is chosen so that the comparatively large step in the band gap between the third cladding layer and the contact layer is divided into two substantially equal steps by this further intermediate layer.

Figure 2:
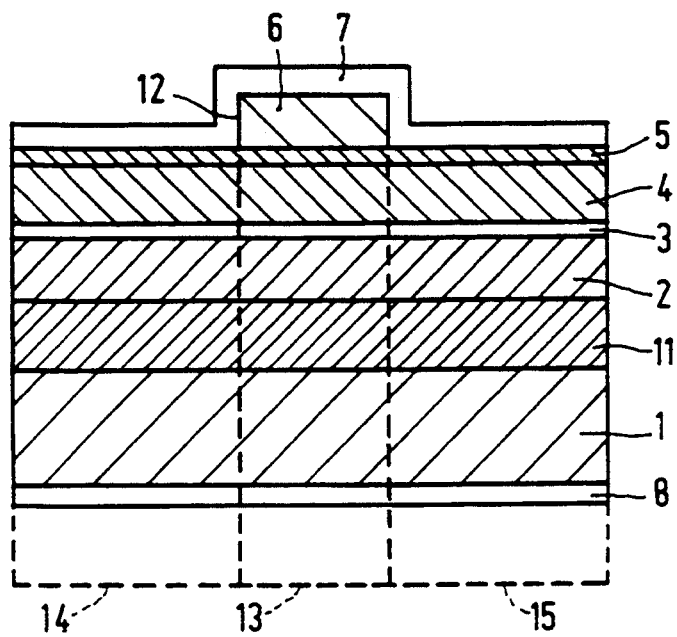
FIG. 2 shows in cross-section a second embodiment of a radiation-emitting semiconductor diode according to the invention.

FIG. 2 shows in cross-section a second embodiment of a radiation-emitting semiconductor diode according to the invention. In this embodiment, the semiconductor diode comprises the same layers as in the preceding embodiment, except two layers, i.e. the third cladding layer 9 and the further intermediate layer 10, which are omitted. The composition, thicknesses and dopings of the remaining layers are, except one, equal to those of the preceding embodiment, as appears from the following table.

| Layer | Semiconductor | Type | Doping concentr. (at/cm$^3$) | Thickness ($\mu$m) | Bandgap |
|---|---|---|---|---|---|
| 1 | GaAs (substrate) | N | $2 \times 10^{18}$ | 350 | 1.4 |
| 11 | GaAs (buffer layer) | N | $2 \times 10^{18}$ | 0.5 | 1.4 |
| 2 | In$_{0.5}$Al$_{0.3}$Ga$_{0.2}$P | N | $2 \times 10^{18}$ | 0.8 | 2.3 |
| 3 | In$_{0.5}$Ga$_{0.5}$P | | — | 0.08 | 1.9 |
| 4 | In$_{0.5}$Al$_{0.3}$Ga$_{0.2}$P | P | $4 \times 10^{17}$ | 0.8 | 2.3 |
| 5 | In$_{0.5}$Ga$_{0.5}$P | P | $1 \times 10^{18}$ | 0.1 | 1.9 |
| 6 | GaAs (contact layer) | P | $2 \times 10^{18}$ | 0.5 | 1.4 |

The radiation-emitting semiconductor diode of this embodiment is also constructed as a diode laser, but now of the gain-guided type. For this purpose, the thickness and the composition of the second cladding layer 4 are substantially equal to those of the first cladding layer 2. Also in this case, according to the invention, there is interposed between the conductive layer 7 and an underlying layer, in this embodiment the second cladding layer 4, an intermediate layer 5, which forms with the conductive layer 7 the junction constituting a barrier, is of the second, so in this case p, conductivity type and comprises a semiconductor material having a band gap different from that of the second cladding layer 4 and the contact layer 6. The properties of this intermediate layer 5 are more or less independent of the properties of the second cladding layer 4 and are chosen according to the invention so that a number of advantages are obtained. As appears from the above table, the second cladding layer 4 comprises, like the remaining cladding layers, indium aluminum gallium phosphide, and the contact layer 6 comprises gallium arsenide. In this embodiment, the intermediate layer 5 comprises indium gallium phosphide, whose band gap deviates from that of the second cladding layer 4 and the contact layer 6. As a result, the intermediate layer 5 can act as etch stopper layer during the formation of the mesa-shaped strip 12. Further, with this composition of the intermediate layer 5, the conductive layer 7 and the intermediate layer 5 form at the area at which they adjoin each other a junction constituting a barrier, which has very favorable current-blocking properties at the operating voltage of a semiconductor diode, which is in this embodiment about 2.5 V. Further, as also appears from the above table, the doping of the intermediate layer 5, which is in this embodiment 1.10$^{18}$ at/cm$^3$, is chosen so that within the mesa-shaped strip 12 a good current passage from the third cladding layer 9 to the second cladding layer 4 is possible. The width of the mesa-shaped strip 12 is in this embodiment about 7 $\mu$m. The radiation emitted by this semiconductor diode laser has a wavelength of about 680 nm. What has been stated above with respect to the composition of the semiconductor layers also applies to this embodiment. The manufacture of the radiation-emitting semiconductor diode laser of this embodiment is effected substantially in the same manner as the manufacture of that of the preceding embodiment.

Figure 3:
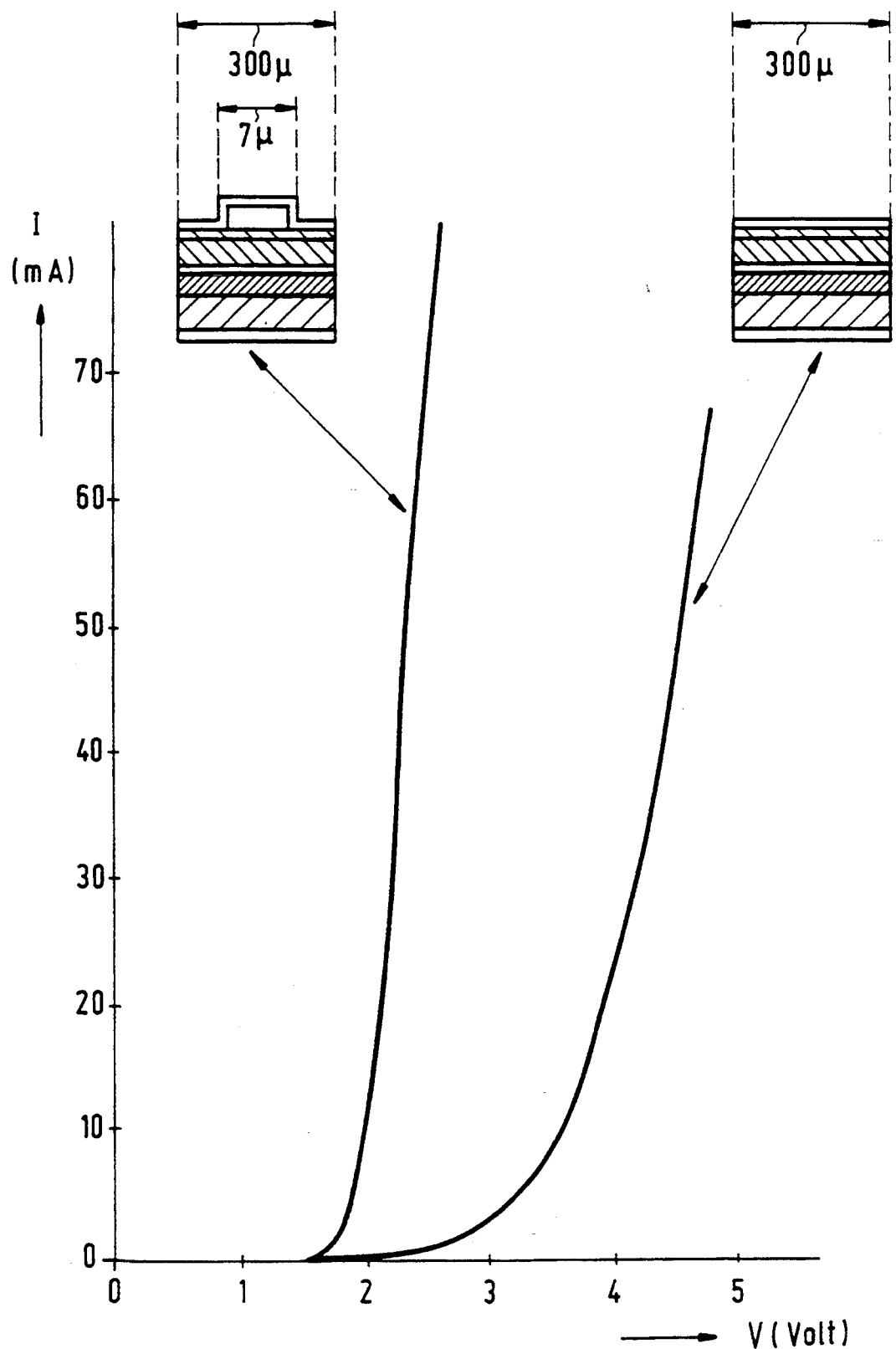
FIG. 3 shows the current-voltage characteristic of the semiconductor diode of FIG. 1 and for comparison the current-voltage characteristic of a comparable diode, in which the contact layer is entirely removed.

FIG. 3 shows the current-voltage characteristic of the semiconductor diode laser shown in FIG. 2 and for comparison the current-voltage characteristic of a comparable diode, in which the contact layer 6 has entirely been removed. The dimensions of both types of diodes are approximately 300 $\times$ 300 $\mu$m$^2$. At a forward voltage of, for example, 2.5 V, a current of about 80 mA flows through the semiconductor diode laser according to the invention, in which the mesa-shaped strip has a width of about 8 $\mu$m, and a current of only 0.6 mA flows through the semiconductor diode, in which the contact layer is completely omitted. This comparison shows that in this manner very simple semiconductor diode lasers, which can be manufactured at low cost, of the gain-guided type can be obtained, in which the current can be limited very effectively to a mesa-shaped strip.

Other variations of this embodiment are also possible. For example, the intermediate layer 5 may also consist of AlGaAs. With an aluminium content of about 40%, a very effective barrier is formed with the conductive layer 7, the GaAs contact layer 6 can be excellently etched selectively and the band gap step between the second cladding layer 4 and the contact layer 6 is divided into two substantially equal steps, as a result of which an excellent current-voltage characteristic is obtained.

The invention is not limited to the embodiments described because many modifications and variations are possible for those skilled in the art within the scope of the invention. For example, other semiconductor materials or other compositions of the semiconductor materials chosen than those mentioned in the embodiments may be used.

The conductivity types may also be replaced all (simultaneously) by the opposite conductivity types. Further, in accordance with the use, a LED construction or a laser construction of a radiation-emitting semiconductor diode according to the invention may be chosen. Within the laser construction, both a gain-guided and an index-guided structure may be chosen, in which the invention may advantageously be utilized. Finally, it should be noted that the methods used in the embodiments of providing the semiconductor layers and the conductive layers partly depend upon the material system in which the semiconductor diode is manufactured and may be replaced by techniques other than those mentioned here: for example, instead of MOCVD, also LPE, VPE or MBE may be used, while instead of sputtering also, for example, vapor deposition may be used.

I claim:

1. A radiation-emitting semiconductor diode comprising a semiconductor body having a semiconductor substrate of a first conductivity type and comprising gallium arsenide (GaAs), which substrate is provided on its lower side with a first conducting layer and on which substrate are successively disposed at least a first cladding layer of the first conductivity type, an active layer, a second cladding layer of a second conductivity type opposite to the first conductivity type, and a contact layer of the second conductivity type comprising gallium arsenide (GaAs), the semiconductor body comprising a mesa-shaped strip which adjoins a surface of the semiconductor body, which strip comprises at least the contact layer and on which contact layer a second conducting layer is disposed, which second conducting layer extends beyond the mesa-shaped strip and forms alongside said mesa-shaped strip with a semiconductor layer underlying the second conducting layer a junction forming a Schottky barrier, wherein the cladding layers comprise one of indium aluminum gallium phosphide (InAlGaP) and indium aluminum phosphide (InAlP), the active layer comprises one of indium gallium phosphide (InGaP) and indium aluminum gallium phosphide having a lower aluminum content than that of the cladding layers, and wherein an intermediate semiconductor layer is disposed between the second conducting layer and the second cladding layer to optimize the electrical properties of the semiconductor diode, which intermediate layer forms with the second conducting layer the junction forming a current-limiting Schottky barrier for a forward current through the radiation-emitting semiconductor diode, is of the second conductivity type and comprises a semiconductor material whose band gap lies between that of the second cladding layer and that of the contact layer.

2. A radiation-emitting semiconductor diode as claimed in claim 1, characterized in that the intermediate layer comprises indium gallium phosphide (InGaP) or indium aluminum gallium phosphide (InAlGaP) having a lower aluminum content than that of the cladding layers.

3. A radiation-emitting semiconductor diode as claimed in claim 2, characterized in that the intermediate layer comprises indium aluminum gallium phosphide (InAlGaP), the aluminum content of which varies from the lower side of the intermediate layer towards the upper side of the intermediate layer from a value equal to the aluminum content of the second cladding layer to a value equal to 0 at. %, the bandgap varying from the bandgap of the second cladding layer to about 1.9 eV.

4. A radiation-emitting semiconductor diode as claimed in claim 1, characterized in that the intermediate layer comprises aluminum gallium arsenide (AlGaAs).

5. A radiation-emitting semiconductor diode as claimed in claim 1, characterized in that the second cladding layer has a doping of $1.10^{17}$ to $5.10^{17}$ atoms/cm$^3$ and the intermediate layer has a doping of $5.10^{17}$ to $4.10^{18}$ atoms/cm$^3$.

6. A radiation-emitting semiconductor diode as claimed in claim 5, characterized in that the doping of the intermediate layer has a gradient such that the doping is higher on the side of the second cladding layer and is lower on the side of the contact layer.

7. A radiation-emitting semiconductor diode as claimed in claim 1, characterized in that the thickness of the intermediate layer lies between about 200 Å and about 2000 Å.

8. A radiation-emitting semiconductor diode as claimed in claim 1, characterized in that the second conducting layer on the upper side of the semiconductor body comprises at least one of platinum (Pt), chromium (Cr) and titanium (Ti).

9. A radiation-emitting semiconductor diode as claimed in claim 1, characterized in that the semiconductor body comprises within the mesa-shaped strip between the intermediate layer and the contact layer a third cladding layer and a further intermediate layer disposed thereon, the value of the band gap of said further intermediate layer being between that of the third cladding layer and that of the contact layer.

* * * * *